(12) United States Patent
Wrycraft et al.

(10) Patent No.: US 7,027,299 B2
(45) Date of Patent: Apr. 11, 2006

(54) ELECTRONICS ASSEMBLY WITH ARRANGEMENT FOR AIR COOLING

(75) Inventors: Sean Conor Wrycraft, Harrow (GB); Jay Kevin Osborn, Crowthorne (GB)

(73) Assignee: Sun Microsystems, Inc., Santa Clara, CA (US)

( * ) Notice: Subject to any disclaimer, the term of this patent is extended or adjusted under 35 U.S.C. 154(b) by 220 days.

(21) Appl. No.: 10/643,811

(22) Filed: Aug. 19, 2003

(65) Prior Publication Data

US 2005/0041391 A1    Feb. 24, 2005

(51) Int. Cl.
*H05K 7/20* (2006.01)

(52) U.S. Cl. ............... 361/695; 165/80.3; 165/185; 257/722; 361/704; 361/703; 361/710; 454/184

(58) Field of Classification Search ...... 165/80.2–80.3, 165/185; 257/706–707, 712–713, 722; 361/687–689, 361/694–695, 700–710, 719–720; 454/184
See application file for complete search history.

(56) References Cited

U.S. PATENT DOCUMENTS

| | | | |
|---|---|---|---|
| 2,957,668 | A | 10/1960 | Norquist et al. |
| 4,083,616 | A | 4/1978 | McNiece et al. |
| 4,751,872 | A | 6/1988 | Lawson, Jr. |
| 4,914,552 | A | 4/1990 | Keemer |
| 4,974,377 | A | 12/1990 | Dominitz et al. |
| 5,100,096 | A | 3/1992 | Mizuno et al. |
| 5,124,886 | A | 6/1992 | Golobay |
| 5,145,243 | A | 9/1992 | Liu |
| 5,189,277 | A | 2/1993 | Boisvert et al. |
| 5,214,572 | A | 5/1993 | Cosimano et al. |
| 5,216,578 | A | 6/1993 | Zenitani et al. |
| 5,264,986 | A | 11/1993 | Ohgami et al. |
| 5,333,830 | A | 8/1994 | Millen |
| 5,373,133 | A | 12/1994 | Brockway et al. |
| 5,394,305 | A | 2/1995 | Moral et al. |
| 5,460,441 | A | 10/1995 | Hastings et al. |
| 5,559,673 | A | 9/1996 | Gagnon et al. |
| 5,562,410 | A | 10/1996 | Sachs et al. |

(Continued)

FOREIGN PATENT DOCUMENTS

EP    1198867    3/2004

(Continued)

OTHER PUBLICATIONS

"Pluggable Fan Assembly", IBM Corp., IBM Technical Disclosure Bulletin, vol. 32, No. 3A, Aug. 1989.

(Continued)

*Primary Examiner*—Greg Thompson
(74) *Attorney, Agent, or Firm*—Meyertons Hood Kivlin Kowert & Goetzel, P.C.; B. Noël Kivlin

(57) ABSTRACT

An electronics assembly, for example a computer that may be employed as a network server, has an enclosure, and a plurality of heat-generating components such as microprocessors located inside the enclosure. One or more fans may be provided for maintaining a through flow of air for cooling the components of the assembly. The heat-generating components are located within the enclosure in line with the direction of the flow of air, and the heat-sinks have a configuration such that the air flows over them in parallel. The heat-sinks may each have a flat base for mounting on the component, and a cantilevered portion having one end located on the base, and another end that extends beyond the base and over the base of the other heat-sink, but not in contact with it.

18 Claims, 4 Drawing Sheets

U.S. PATENT DOCUMENTS

| | | | |
|---|---|---|---|
| 5,593,219 A | 1/1997 | Ho | |
| 5,644,991 A | 7/1997 | Prevot et al. | |
| 5,663,868 A | 9/1997 | Stalley et al. | |
| 5,734,558 A | 3/1998 | Poplawski et al. | |
| 5,734,561 A | 3/1998 | Wolf et al. | |
| 5,737,187 A * | 4/1998 | Nguyen et al. | 361/704 |
| 5,741,985 A | 4/1998 | Gaete | |
| 5,758,855 A | 6/1998 | Jordan et al. | |
| 5,777,845 A | 7/1998 | Krum et al. | |
| 5,788,467 A | 8/1998 | Zenitani et al. | |
| 5,808,876 A | 9/1998 | Mullenbach et al. | |
| 5,838,551 A | 11/1998 | Chan | |
| 5,864,088 A | 1/1999 | Sato et al. | |
| 5,877,938 A | 3/1999 | Hobbs et al. | |
| 5,884,988 A | 3/1999 | Foo et al. | |
| 5,886,639 A | 3/1999 | Behl et al. | |
| 5,914,864 A | 6/1999 | MacDonald et al. | |
| 5,944,199 A | 8/1999 | Corisis et al. | |
| 5,973,926 A | 10/1999 | Sacherman et al. | |
| 5,975,659 A | 11/1999 | Yang et al. | |
| 5,980,295 A | 11/1999 | Lai et al. | |
| 5,996,960 A | 12/1999 | Krajec | |
| 6,023,413 A * | 2/2000 | Umezawa | 361/697 |
| 6,031,719 A | 2/2000 | Schmitt et al. | |
| 6,031,733 A | 2/2000 | Corisis et al. | |
| 6,040,981 A | 3/2000 | Schmitt et al. | |
| 6,061,237 A | 5/2000 | Sands et al. | |
| 6,075,694 A | 6/2000 | Mills et al. | |
| 6,075,698 A | 6/2000 | Hogan et al. | |
| 6,088,222 A | 7/2000 | Schmitt et al. | |
| 6,115,237 A | 9/2000 | Zahorsky et al. | |
| 6,115,250 A | 9/2000 | Schmitt | |
| 6,129,327 A | 10/2000 | Dubois | |
| 6,138,347 A | 10/2000 | Persson et al. | |
| 6,141,211 A | 10/2000 | Strickler et al. | |
| 6,147,862 A | 11/2000 | Ho | |
| 6,147,873 A | 11/2000 | Huang | |
| 6,166,900 A | 12/2000 | Flynn et al. | |
| 6,185,097 B1 | 2/2001 | Behl | |
| 6,191,928 B1 | 2/2001 | Rector et al. | |
| 6,213,819 B1 | 4/2001 | Fan | |
| 6,215,659 B1 | 4/2001 | Chen | |
| 6,219,229 B1 | 4/2001 | Lee | |
| 6,227,515 B1 | 5/2001 | Broyles | |
| 6,236,564 B1 | 5/2001 | Fan | |
| 6,239,972 B1 * | 5/2001 | Tehan et al. | 361/704 |
| 6,244,953 B1 | 6/2001 | Dugan et al. | |
| 6,247,898 B1 | 6/2001 | Henderson et al. | |
| 6,252,770 B1 | 6/2001 | Yu et al. | |
| 6,256,205 B1 | 7/2001 | Perry et al. | |
| 6,267,606 B1 | 7/2001 | Poplawski et al. | |
| 6,285,547 B1 | 9/2001 | Vigeant et al. | |
| 6,288,898 B1 | 9/2001 | Johnson et al. | |
| 6,292,361 B1 | 9/2001 | Johnson et al. | |
| 6,297,950 B1 | 10/2001 | Erwin | |
| 6,322,042 B1 | 11/2001 | Nemec | |
| 6,324,075 B1 | 11/2001 | Unrein et al. | |
| 6,325,636 B1 | 12/2001 | Hipp et al. | |
| 6,327,144 B1 | 12/2001 | May | |
| 6,330,156 B1 | 12/2001 | Cresse | |
| 6,364,761 B1 | 4/2002 | Steinbrecher | |
| 6,373,695 B1 | 4/2002 | Cheng | |
| 6,373,698 B1 | 4/2002 | Christensen | |
| 6,388,875 B1 | 5/2002 | Chen | |
| 6,395,976 B1 | 5/2002 | Koradia et al. | |
| 6,411,506 B1 | 6/2002 | Hipp et al. | |
| 6,411,526 B1 | 6/2002 | Nguyen et al. | |
| 6,412,948 B1 | 7/2002 | Yanari | |
| 6,414,845 B1 | 7/2002 | Bonet | |
| 6,442,020 B1 | 8/2002 | Liu et al. | |
| 6,442,024 B1 * | 8/2002 | Shih | 361/695 |
| 6,464,578 B1 | 10/2002 | Chin et al. | |
| 6,473,297 B1 | 10/2002 | Behl et al. | |
| 6,480,391 B1 | 11/2002 | Monson et al. | |
| 6,510,055 B1 | 1/2003 | Liu et al. | |
| 6,515,854 B1 | 2/2003 | Claprood | |
| 6,522,539 B1 | 2/2003 | Ota et al. | |
| 6,526,333 B1 | 2/2003 | Henderson et al. | |
| 6,549,406 B1 | 4/2003 | Olesiewicz et al. | |
| 6,556,437 B1 | 4/2003 | Hardin | |
| 6,563,706 B1 | 5/2003 | Strickler | |
| 6,572,207 B1 | 6/2003 | Hase et al. | |
| 6,590,768 B1 | 7/2003 | Wiley | |
| 6,594,148 B1 | 7/2003 | Nguyen et al. | |
| 6,621,708 B1 | 9/2003 | Sparkes et al. | |
| 6,621,709 B1 | 9/2003 | Schnabel et al. | |
| 6,621,711 B1 | 9/2003 | Haworth et al. | |
| 6,678,157 B1 | 1/2004 | Bestwick | |
| 6,680,850 B1 | 1/2004 | Osborn et al. | |
| 6,683,794 B1 | 1/2004 | Schnabel et al. | |
| 6,700,351 B1 | 3/2004 | Blair et al. | |
| 6,775,138 B1 * | 8/2004 | Lee et al. | 361/697 |
| 6,813,149 B1 * | 11/2004 | Faneuf et al. | 361/687 |
| 6,888,725 B1 * | 5/2005 | Kubo et al. | 361/719 |
| 2002/0044421 A1 | 4/2002 | Cheng | |
| 2002/0048520 A1 | 4/2002 | Lu et al. | |
| 2002/0060900 A1 | 5/2002 | Qui | |
| 2002/0112653 A1 | 8/2002 | Moore et al. | |
| 2002/0126461 A1 | 9/2002 | Yazaki | |
| 2002/0167797 A1 | 11/2002 | Willars et al. | |
| 2002/0173265 A1 | 11/2002 | Kipka et al. | |
| 2003/0063454 A1 | 4/2003 | Wilson et al. | |
| 2003/0226675 A1 | 12/2003 | Osborn et al. | |
| 2003/0226949 A1 | 12/2003 | Cain et al. | |
| 2003/0227752 A1 | 12/2003 | Yair et al. | |
| 2003/0227755 A1 | 12/2003 | Haworth | |
| 2003/0227757 A1 | 12/2003 | Vincent et al. | |
| 2003/0228840 A1 | 12/2003 | Gough et al. | |
| 2004/0032722 A1 | 2/2004 | Wrycraft et al. | |

FOREIGN PATENT DOCUMENTS

| | | |
|---|---|---|
| GB | 2211360 | 6/1989 |
| JP | 05-021973 | 1/1993 |
| JP | 2000-151137 | 5/2000 |
| JP | 2002-145267 | 5/2002 |
| JP | 2002-145269 | 5/2002 |
| WO | 99/60834 | 11/1999 |

OTHER PUBLICATIONS

"Fan/Board Mounting Bracket", IBM Corp., IBM Technical Disclosure Bulleting, vol. 38, No. 06A, Jun. 1993.

* cited by examiner

ELECTRONICS ASSEMBLY WITH ARRANGEMENT FOR AIR COOLING

BACKGROUND OF THE INVENTION

This invention relates to electronics assemblies, for example to computer systems, and to thermal management thereof.

Certain systems may be employed as servers, for example in local area networks (LANs), or in wide area networks (WANS), telecommunications systems or other operations such as database management or as internet servers. Such servers may be used in so-called "horizontally scaled" applications in which tens or hundreds of corresponding servers are employed as part of a distributed system.

A typical computer employed for such purposes will comprise a pair of microprocessors mounted on a circuit board, together with other components such as power supply units (PSUs), hard disc drives (HDDs), fans, digital video disc (DVD) players, memory modules, ethernet ports etc. The servers may be designed in modular form so that they can be stacked together with other corresponding servers in large racks. For example, some servers may be designed with a height in the order of 10 cm and a width in the order of 5 cm.

Whatever the dimensions of the assembly, it can often be a problem to ensure that such systems are cooled adequately in view of the relatively large number of electronics components in an enclosed environment. The assembly enclosure may be provided with one or more enclosure fans in one of the assembly walls which provide a flow of air through the assembly, e.g. from front to back.

However, as microprocessors have become more powerful, they therefore generate larger quantities of heat, 20 to 30 watts of heat output or higher not being uncommon. It has accordingly been difficult to ensure adequate cooling of the microprocessors. In addition, the servers may not always be employed in data centres with air conditioned environments, and ambient temperatures may therefore be relatively high. For example, the NEBS standard requires that such a system will operate at ambient temperatures of up to about 55° C. without the junction temperature of the components exceeding their specification, for example about 85° C.

Furthermore, because of relatively restricted lateral dimensions of the enclosures, it is often the case that one of the microprocessors is placed in front of the other, with the result that the rearmost processor receives cooling air that has already been heated by the front processor.

SUMMARY OF THE INVENTION

According to one aspect of the present invention, there is provided an electronics assembly which comprises:
(i) an enclosure;
(ii) a plurality of heat-generating components located within the enclosure that are provided with heat-sinks; and
(iii) one or more fans for providing a flow of air through the enclosure for cooling the components;

the components being located within the enclosure in line with the direction of the flow of air, and the heat-sinks having a configuration such that the air flows over the heat-sinks in parallel.

In any such assembly, there will typically be a number of electronics components that will generate heat to a greater or lesser extent. However, most components, for example memory circuits, passive components and the like, will generate relatively small quantities of heat, while a small number of components, and in particular microprocessors, will generate significantly larger quantities of heat. The term "heat-generating component" as used herein is intended to refer to components such as microprocessors that generate significantly more heat than the average component in the enclosure.

This form of assembly has the advantage that the efficiency of thermal management within the enclosure can be significantly improved. By virtue of this arrangement, it is possible to ensure that each heat-generating component has a heat-sink that is cooled by air coming directly from outside the enclosure without having previously been heated by any other such heat-generating component.

Each heat-sink may be mounted on one of the heat-generating components, and may have a cantilevered portion that extends over the other heat-generating component or one of the other heat generating components but is not in thermal contact therewith. Thus, each heat-sink may extend over both the components in plan view but be in thermal contact only with a single component, thereby enabling the same "footprint" of the components and heat-sinks to be maintained. The cantilevered portion of the heat-sink may be in physical contact with the other component or the other heat-sink by means of a thermal insulator, or they may be separated by an air gap.

In principle, the heat-sinks may be employed with any number of heat-generating components, for example with three or more, but often the assembly will contain only two such components. In such a case, each heat-sink may have a generally flat base that is mounted on its associated heat-generating component, and a cantilevered portion that is provided with cooling fins and which extends over up to one half of the transverse dimension of its associated heat-generating component in the direction of air flow. The cantilevered portion of each heat-sink may extend over the base of the other heat-sink, and have a lower surface that is sufficiently higher than the upper surface of the base to allow clearance between the cantilevered portion and the base of the other heat-sink.

According to another aspect of the present invention, there is provided a method of cooling a plurality of heat-generating components in an electronics assembly, which comprises:
(i) providing a heat-sink on each of the heat-generating components; and
(ii) causing air to flow over the heat-sinks;

the components being located within the enclosure in line with the direction of the flow of air, and the heat-sinks having a configuration such that the air flows over the heat-sinks in parallel.

The heat-sink described herein is novel per se and so, according to yet another aspect of the invention, there is provided a heat-sink for allowing cooling of a heat-generating electronics component, which comprises:
(i) a generally flat base for mounting on the component; and
(ii) a cantilevered portion having one end that is located on, and supported by, the base and another end that extends beyond the base, the cantilevered portion having a plurality of fins extending therealong to allow forced-air cooling of the heat-sink;

wherein the cantilevered portion extends over not more than one half of the base in a direction transverse to its length.

BRIEF DESCRIPTION OF THE DRAWINGS

Embodiments of the present invention will now be described in detail by way of example with reference to the accompanying drawings, in which corresponding parts are given like reference numbers. In the drawings.

DESCRIPTION OF PARTICULAR EMBODIMENTS

Figure 1:
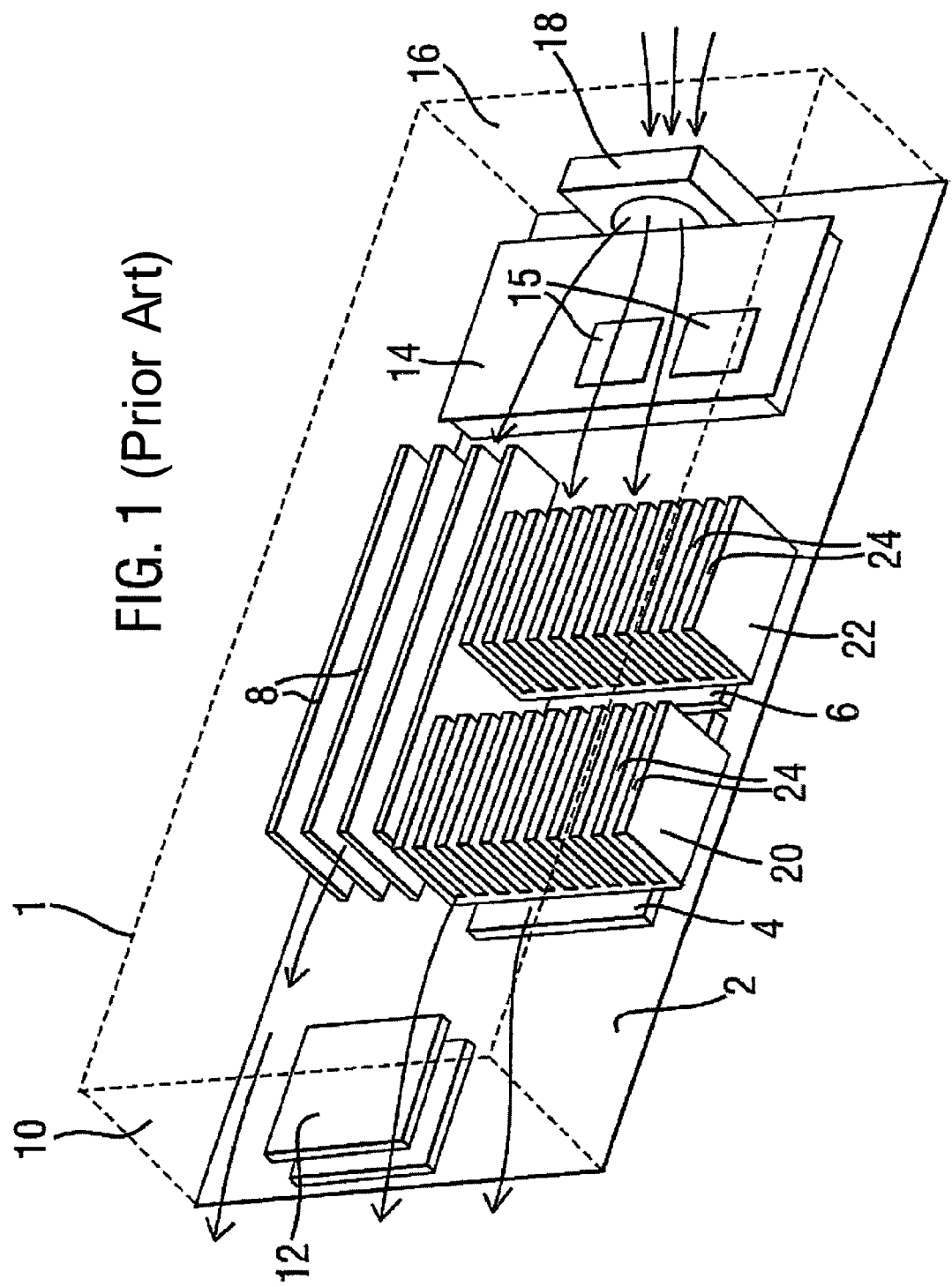
FIG. 1 is a schematic perspective view of a conventional electronics assembly forming a network server.

Referring now to the drawings, in which like reference numerals are used to designate corresponding elements, FIG. 1 is a schematic perspective view of a conventional narrow form factor computer that is intended to provide a rack mounted server for use with the internet or as part of a local area network (LAN) or for other telecommunications purposes. The computer is designed to fit into a rack along with a number of other such computers, for operation in a data centre. The assembly may be designed to be a so-called "high RAS" system, that is to say, to have high reliability, availability and serviceability, so that it can be operated with the minimum amount of down time, although for other systems, different criteria such as cost may be more important. The computer may, for some applications, be intended to function continuously with the down time in the order of minutes per year.

The computer comprises an enclosure 1 shown in ghost lines, and contains a printed circuit board (PCB) 2 on which all, or the majority of, the components are mounted. The computer contains a pair of microprocessors 4 and 6 located on the PCB 2, to the side of a number of dynamic random access memory (DRAM) cards 8 that may have a variety of functions, for example to provide memory, input/output (I/O) functions or the like. The enclosure has a front wall 16 which may have a number of keys, switches and/or status output devices, and may include devices such as disc drives, CD ROM drives, digital video disc (DVD) drives, tape drives etc. To the rear of the enclosure, a mezzanine PCB 14 is provided which may support a number of additional modules or other components 15. One or more connectors 12 may be located on a rear wall 10 of the enclosure to form a connection as the sever is pushed into the rack. In addition one or more fans may be located on the front wall 16, or alternatively on the rear wall 10, in order to generate a flow of air through the enclosure for cooling the components.

It will be appreciated that the enclosure may contain a large number of additional components, but these have been omitted for the sake of clarity. In addition, the assembly may have a number of different configurations or combinations of components.

In order to improve performance of the system two microprocessors 4 and 6 may be employed. Depending on the operating system (OS) and the capability of the software, this improvement may be achieved by symmetric multiple processing (SMP) and/or software applications that can split into separate threads and run concurrently, one on each processor. Because of the geometry of the assembly, especially its relatively small lateral dimensions, and the existence of the cards 8 that extend from the front to back along one side of the enclosure, the microprocessors 4 and 6 are placed one behind the other.

These microprocessors, by their nature, tend to generate more heat than other electronics components of the assembly, for example in the region of 20 to 30 W each or even more in some cases. For this reason, the microprocessors are each provided with a heat-sink 20, 22 in order to maintain their temperatures within acceptable operating limits. In addition, (dependent on geometry and performance), the thermal conductivity across the flat heatsink base may need to be enhanced. This may be achieved via higher thermal conductivity materials, e.g. copper or graphite (aligned in the correct orientation) or an embedded phase-change fluid solution such as a vapour-chamber or heat-pipe(s).

The heat-sinks 20 and 22 are typically in the form of a block of metal, e.g. aluminium or other high thermal conductivity material having a number of fins 24 oriented so that the air flow will be parallel to the plane of the fins. As can be seen from FIG. 1, in order to provide an adequate degree of cooling, the heat-sinks 20, 22 need to be quite sizable, and may take up a significant fraction of the lateral dimensions of the enclosure. For example, in the assembly shown in FIG. 1, the heat sinks 20 and 22 occupy slightly more than half the internal lateral dimensions of the enclosure 1. However, because the two microprocessors are positioned one behind the other in the direction of the airflow, the heat-sink 22 of microprocessor 6 that is located closest to the front of the enclosure will receive cooling air at ambient temperature, while the microprocessor 4 and its associated heat-sink 20 located toward the rear of the enclosure 1 will receive cooling air only after it has been warmed up by the front microprocessor 6 and heat-sink 22. This can cause a problem in trying to balance the cooling of the two microprocessors and in trying to maintain the rearmost microprocessor 4 within acceptable temperature limits. While one could modify the assembly in order to position the two microprocessors side-by-side, this will inevitably require a considerable modification of the design of the assembly, circuit boards etc., and may well not be possible without altering the size and shape of the enclosure. Furthermore, in order to optimise the length of the electrical connections to the DRAM cards 8 it is preferred to space the microprocessors 4 and 6 equally alongside the cards 8 rather than at one end.

Figure 2:
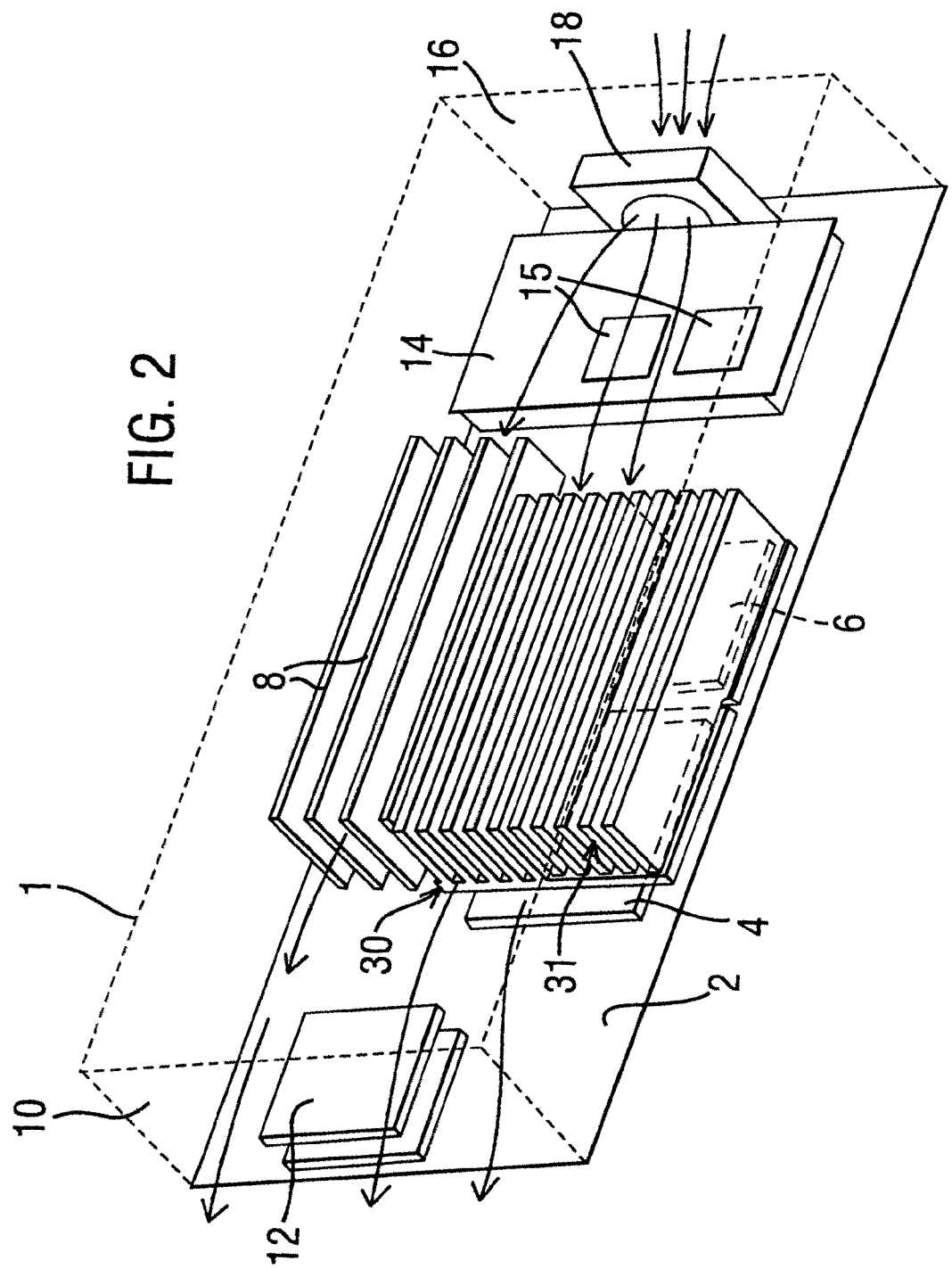
FIG. 2 is a schematic perspective view of an electronics assembly according to the present invention.
Figure 3:
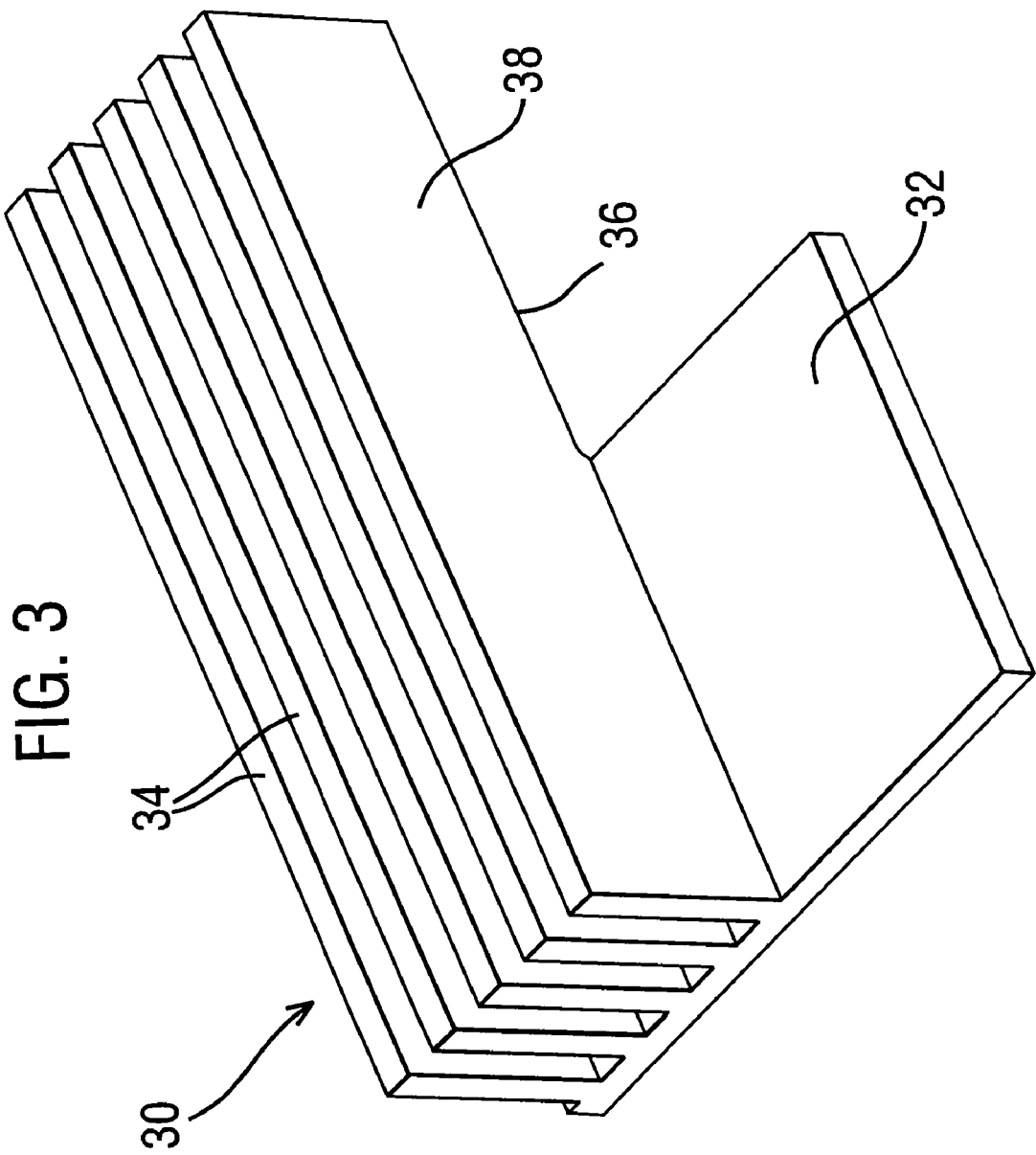
FIG. 3 is an isometric view of a heat-sink according to the present invention.

FIG. 2 shows an assembly of the same general form as that shown in FIG. 1 which has been modified according to one aspect of the present invention by providing heat-sinks 30 and 31 that are each in thermal contact with one of the microprocessors 4 and 6, but are essentially positioned side-by-side. FIG. 3 shows one heat-sink 30 for a heat-generating component such as a microprocessor that is employed in the assembly as shown in FIG. 2 in greater detail.

The heat-sink 30 has a generally flat base 32 for mounting on the component. The base is generally square as shown in FIG. 3, but will normally have the same shape as that of the component to be cooled, and may be bonded to the component by means of an adhesive, for example one having a relatively high thermal conductivity or alternatively may be attached by mechanical attachments e.g. screws or spring clips together with a high conductivity compliant gasket (thermal interface material). On the base 32 is located a an assembly of fins 34, five as shown for the sake of clarity, but other numbers of fins may be employed, for example from 3 to 20 fins. In this case, the fins are longer than the base 32 so that they extend beyond the edge of the base in a cantilevered manner. The fins 34 may extend significantly beyond the base, and may, for example have a length that is at least twice the dimension of the base (in the direction of the fins). In this embodiment the fins generally have a length that is equal to twice the dimension of the base of the heat-sink plus the distance separating the microprocessors. In addition, the fins 34 do not extend over the entire dimension of the base 32 in a direction perpendicular to their length (i.e. perpendicular to the flow of air in use, referred to hereafter as the width of the base) but instead extends over somewhat less than one half of the width of the base 32, and are located on one side of the base so that at least one half of the base 32 has no fins. In addition, the under edge or surface 36 of that part of the fins 34 that extends beyond the base 32 is raised slightly above the level of the base, for example by a distance of from 0.5 to 4 mm.

Figure 4:
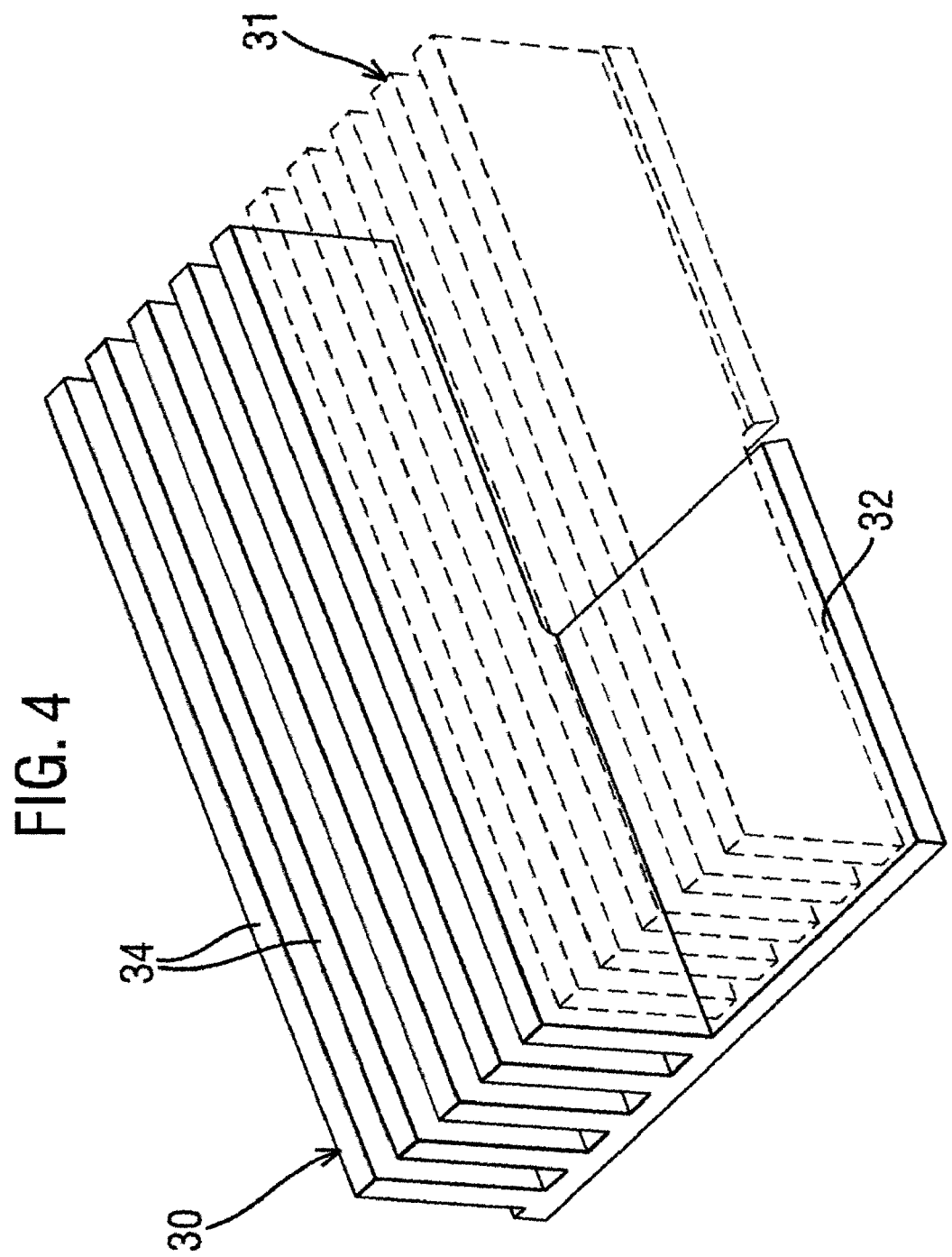
FIG. 4 is a view of the heat-sink as shown in FIG. 3 together with a further heat-sink for an associated heat-generating component.

FIG. 4, shows how two such heat-sinks may be placed together after rotating one heat-sink through 180°, one heat-sink being shown in outline only. In this arrangement, the parts 38 of the fins of one heat-sink that extend beyond the edge of the base 32 are located over the base 32 of the other heat-sink but are not in contact with the other heat sink. For example they can be separated from the base and from the fins of the other heat-sink by a distance of about 1 to 3 mm. In this way two heat-sinks are provided that can be substantially the same size as the conventional heat-sinks shown in FIG. 1 with substantially the same plan view or footprint and with substantially the same height and transverse dimensions. The two heat-sinks will both receive ambient cooling air directly from outside the enclosure without being warmed by other components to a significant extent. However, because each heat-sink is in direct physical contact with only one of the microprocessors and does not contact the other heat-sink, each heat-sink will provide for cooling of its associated microprocessor only. The microprocessors are, therefore, cooled by the airflow in parallel with each other even though they are positioned such that they would normally receive cooling air sequentially.

As shown in FIGS. 3 and 4, the base of each heat-sink extends over substantially the entire heat-generating component so that the cantilevered part of the fins of the other heat-sink are located over the remaining part of the base 32. While such a design has the advantage that thermal conduction between the component and its associated heat-sink is maximised, it is possible in some circumstances for the heat-sink to be located over only a part of a heat-generating component.

Other designs of heat-sink may alternatively be employed depending on the design and location of the heat-generating components. For example, three heat-generating components could be positioned in line with the flow of air with each heat-sink designed so that a portion thereof, e.g. the fins, extend over the other two components and so that the lateral dimension of the fins is only substantially one third the lateral dimension of the base of the heat-sink or of the component. Even more components positioned in the line of the airflow could be cooled by this arrangement.

The heat-sinks and the assembly have been described above with reference to cooling of microprocessors. However, other components that generate significant quantities of heat, for example power supplies and the like may also be cooled by such an arrangement.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An electronics assembly which comprises:
   (i) an enclosure;
   (ii) a plurality of heat-generating components located within the enclosure that are provided with heat-sinks; and
   (iii) one or more fans for providing a flow of air through the enclosure for cooling the heat-generating components; the heat-generating components being located within the enclosure sin line with the direction of the flow of air, and the heat-sinks having a configuration such that the air flows over the heat-sinks in parallel;
   wherein at least one of the heat-sinks is mounted on one of the heat-generating components and has a cantilevered portion that extends over at least part of another of the heat-generating components.

2. The assembly as claimed in claim 1, which includes two such heat-generating components.

3. The assembly as claimed in claim 1, wherein each heat-sink is mounted on one of the heat-generating components, and wherein each has the cantilevered portion that extends over other of the heat-generating components but is not in contact therewith.

4. The assembly as claimed in claim 1, wherein each heat-sink has a plurality of cooling fins.

5. The assembly as claimed in claim 4, wherein the heat-generating components are mounted on a generally planar circuit board, and the fins are oriented generally perpendicular to the plane of the circuit board.

6. The assembly as claimed in claim 3, wherein each heat-sink has a plurality of cooling fins that are located on the cantilevered portion.

7. The assembly as claimed in claim 3, wherein each cantilevered portion extends over up to one half the transverse dimension of its associated heat-generating component in the direction of air flow.

8. The assembly as claimed in claim 2, wherein each heat-sink has a generally flat base that is mounted on its associated heat-generating component, and each heat-sink has the cantilevered portion that is provided with cooling fins and which extends over up to one half of a transverse dimension of its associated heat-generating component in the direction of air flow, the cantilevered portion of each heat-sink extending over the base of the other heat-sink, and having a lower surface that is sufficiently higher than an upper surface of the base to allow clearance between the cantilevered portion and the base of the other heat-sink.

9. The assembly as claimed in claim 2, wherein the heat-sinks are substantially identical, and each heat-sink is oriented at 180 degrees with respect to the other heat-sink.

10. The assembly as claimed in claim 1, wherein each heat-generating component generates substantially the same quantity of heat as the other heat-generating components.

11. The assembly as claimed in claim 1, wherein each heat-generating component is a microprocessor.

12. The assembly as claimed in claim 1, wherein the enclosure has a generally flat shape to allow the enclosure to be stacked with one or more other such enclosures while allowing access to one or more side walls thereof.

13. The assembly as claimed in claim 12, wherein the assembly is a rack-mounted assembly.

14. The assembly as claimed in claim 1, wherein the essembly is a network server.

15. A method of cooling a plurality of heat-generating components in an electronics assembly, comprising:
- (i) providing a heat-sink on each of the heat-generating components; and
- (ii) causing air to flow over the heat-sinks; the heat-generating components being located within an enclosure in line with a direction of the flow of air, and the heat-sinks having a configuration such that the air flows over he heat-sinks in parallel;

wherein at least one of the heat-sinks is mounted on one of the heat-generating components and has a cantilevered portion that extends over at least part of another of the heat-generating components.

16. The method as claimed in claim 15, wherein the heat-generating components are mounted on a generally planar circuit board, and air is caused to flow over the heat-sinks in a direction generally parallel to the plane of the circuit board.

17. A heat-sink for allowing cooling of a heat-generating electronics component, which comprises:
- (i) a generally flat base for mounting on the component; and
- (ii) a cantilevered portion having one end that is located on, and supported by, the base and another end that extends beyond the base, the cantilevered portion having a plurality of fins extending therealong to allow forced-air cooling of the heat-sink;

wherein the cantilevered portion extends over not more than one half of the base in a direction transverse to its length.

18. The heat-sink as claimed in claim 17, wherein the cantilevered portion has a lower edge that is higher than an upper surface of the base.

* * * * *

UNITED STATES PATENT AND TRADEMARK OFFICE
CERTIFICATE OF CORRECTION

| | | |
|---|---|---|
| PATENT NO. | : 7,027,299 B2 | Page 1 of 1 |
| APPLICATION NO. | : 10/643811 | |
| DATED | : August 19, 2003 | |
| INVENTOR(S) | : Wrycraft et al. | |

It is certified that error appears in the above-identified patent and that said Letters Patent is hereby corrected as shown below:

Column 6,

Line 6, please delete "essembly" and substitute -- assembly --

Column 6,

Line 19, please delete "sin" and substitute -- in --

Column 6,

Line 31, please delete "other" and substitute -- another --

Signed and Sealed this

Fifth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 7,027,299 B2  Page 1 of 1
APPLICATION NO. : 10/643811
DATED : April 11, 2006
INVENTOR(S) : Wrycraft et al.

It is certified that error appears in the above-identified patent and that said Letters Patent is hereby corrected as shown below:

Column 6,

Line 6, please delete "essembly" and substitute -- assembly --

Column 6,

Line 19, please delete "sin" and substitute -- in --

Column 6,

Line 31, please delete "other" and substitute -- another --

This certificate supersedes Certificate of Correction issued September 5, 2006.

Signed and Sealed this

Seventh Day of November, 2006

JON W. DUDAS
*Director of the United States Patent and Trademark Office*